United States Patent
Nagarajan et al.

(10) Patent No.: US 7,961,123 B2
(45) Date of Patent: Jun. 14, 2011

(54) TIME-INTERLEAVED ANALOG-TO-DIGITAL CONVERTER

(75) Inventors: Viswanathan Nagarajan, Bangalore (IN); Sriram Murali, Bangalore (IN); Sthanunathan Ramakrishnan, Bangalore (IN); Visvesvaraya Pentakota, Bangalore (IN); Jaiganesh Balakrishnan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/575,337

(22) Filed: Oct. 7, 2009

(65) Prior Publication Data

US 2011/0006933 A1    Jan. 13, 2011

(51) Int. Cl.
  *H03M 1/06* (2006.01)
(52) U.S. Cl. .................. 341/118; 341/155; 341/156
(58) Field of Classification Search .............. 341/118, 341/155
  See application file for complete search history.

(56) References Cited

U.S. PATENT DOCUMENTS

| | | | | |
|---|---|---|---|---|
| 4,345,241 | A * | 8/1982 | Takeuchi et al. | 341/118 |
| 4,763,105 | A * | 8/1988 | Jenq | 341/120 |
| 5,294,926 | A | 3/1994 | Corcoran | |
| 6,452,518 | B1 * | 9/2002 | Kawabata | 341/118 |
| 6,542,017 | B2 | 4/2003 | Manganaro | |
| 6,570,410 | B2 | 5/2003 | Manganaro | |
| 6,771,203 | B1 | 8/2004 | Nairn | |
| 7,135,999 | B2 * | 11/2006 | Kuttner et al. | 341/118 |
| 7,283,074 | B2 * | 10/2007 | Sheng et al. | 341/120 |
| 7,352,316 | B2 | 4/2008 | Hori et al. | |
| 7,501,967 | B2 | 3/2009 | Draxelmayr et al. | |
| 7,808,408 | B2 * | 10/2010 | Madisetti et al. | 341/118 |
| 2006/0097901 | A1 | 5/2006 | Draxelmayr et al. | |
| 2007/0069937 | A1 | 3/2007 | Balakrishnan et al. | |

OTHER PUBLICATIONS

"Analysis and Ccompensation of Nonlinearity Mismatches in Time-Interleaved ADC Arrays," IEEE International Symposium on Circuits and Systems, 2004, pp. 593-596 (Christian Vogel and Gernot Kubin).

"Comprehensive, Error Analysis of Combined Channel Mismatch Effects in Time-interleaved ADCs,"IEEE Instrumentation and Measurement Technology Conference, May 20-22, 2003, pp. 733-738 (C. Vogel).

"Compensation of Timing Mismatches in Time-Interleaved Analog-to-Digital Converters Through Transfer Characteristics Tuning," 47th Midwest Symposium on Circuits and Systems, 2004, pp. 1341-1344 (C. Vogel, D. Draxelmayr, and F. Kuttner.

(Continued)

*Primary Examiner* — Khai M Nguyen
(74) *Attorney, Agent, or Firm* — John J. Patti; Wade J. Brady, III; Frederick J. Telecky, Jr.

(57) ABSTRACT

A time-interleaved (TI) analog-to-digital converter (ADC) is provided. The TI ADC generally comprises a clock generator, two or more ADCs, adjustable delay elements, and an estimator. The clock generator generates clock signals. Each ADC is associated with at least one of the clock signals so as to sample an input signal that is generally wide-sense stationary at sampling instants, where correlation function exist between samples from a two or more of the ADCs that is a function of the time differences between associated sampling instants. The estimator is coupled to each of the adjustable delay elements and each of the ADCs so as to calculate the correlation function and adjust the adjustable delay elements to account for sampling mismatch between the ADCs based at least in part on the correlation function.

18 Claims, 5 Drawing Sheets

OTHER PUBLICATIONS

"A Frequency Domain Method for Blind Identification of Timing Mismatches in Time-Interleaved ADCs," Proceedings of the IEEE Norchip Conference, Nov. 2006, pp. 45-48( C. Vogel).

"LMS-based Identification and Compensation of Timing Mismatches in a Two-Channel Time-Interleaved Analog-to-Digital Converter," Proceedings of the IEEE Norchip Conference, Nov. 2007, pp. 1-4 (Shahzad Saleem and Christian Vogel).

"Adaptive Blind Compensation of Gain and Timing Mismatches in M-Channel Time-Interleaved ADCs," Proceedings of 15th IEEE International Conference on Electronics, Circuits and Systems, Aug. 31, 2008-Sep. 3, 2008, pp. 49-52 (V. Vogel, S. Saleem and S. Mendel).

"A Flexible and Scalable Structure to Compensate Frequency Response Mismatches in Time-Interleaved ADCs," IEEE Transactions on Circuits and Systems I: Regular Papers, vol. 56, Issue 11, Nov. 2009 pp. 2463-2475 (C. Vogel and S. Mendel).

"Blind Adaptive Equalization of Mismatch Errors in a Time-Interleaved A/D Converter System," IEEE Transactions on Circuits and Systems 1: Regular Papers, vol. 51, Issue 1, Jan. 2004 pp. 151-158 (J. Elbornsson, F. Gustafsson, J. Eklund).

* cited by examiner

TIME-INTERLEAVED ANALOG-TO-DIGITAL CONVERTER

This application is claims priority to Indian Patent Application No. 1638/CHE/2009, which is hereby incorporated by reference for all purposes.

TECHNICAL FIELD

The invention relates generally to an analog-to-digital converter (ADC) and, more particularly, to a time-interleaved (TI) ADC.

BACKGROUND

Referring to FIG. 1 of the drawings, the reference numeral 100 generally designates a conventional TI ADC. The TI ADC 100 generally comprises a divider 102, ADCs 104-0 to 104-(M−1), and a multiplexer or mux 106. In operation, the divider 102 divides a clock signal CLK (with a frequency of $F_S$) into M clock signals (each with a frequency of $F_S/M$) that are staggered and provided to ADCs 104-0 to 104-(M−1). This allows each of ADCs 104-0 to 104-(M−1) to convert the analog signal X(t) to digital output signals $X_0(k)$ to $X_{M-1}(k)$ that can be multiplexed by mux 106 to generate a digital output signal X(k).

ADCs 104-0 to 104-(M−1), though, are not identical to each other; there are differences, which result in differences in the output signals $X_0(k)$ to $X_{M-1}(k)$. Accordingly, each of the output signals $X_0(k)$ to $X_{M-1}(k)$ can be modeled as follows:

$$X_i(k)=G_i X((kM+i)T_S+\delta_i)+DC_i \forall i \in [0,M-1], \quad (1)$$

where $G_i$, $\delta_i$, and $DC_i$ are the gain, timing error, and DC offset for the ADC 104-$i$, and where $T_S$ is the period of clock signal CLK or the sampling period. Ideally, $G_i$, $\delta_i$, and $DC_i$ are equal to 1, 0, and 0 (respectively). A difficulty in the building and operation of a TI ADC, such as TI ADC 100, is accounting for the timing error or sampling mismatches $\delta_i$.

Some examples of conventional circuit are: U.S. Pat. No. 5,294,926; U.S. Pat. No. 6,542,017; U.S. Pat. No. 6,570,410; U.S. Pat. No. 6,771,203; U.S. Pat. No. 7,352,316; U.S. Pat. No. 7,501,967; U.S. Patent Pre-Grant Publ. No. 2006/0097901; U.S. Patent Pre-Grant Publ. No. 2007/0069937; Vogel, "Comprehensive Error Analysis of Combined Channel Mismatch Effects in Time-Interleaved ADCs," *Instrumentation and Measurement Technology Conference*, pp. 733-738, May 20-22, 2003; Vogel et al., "Analysis and compensation of nonlinearity mismatches in time-interleaved ADC arrays," *IEEE International Symposium on Circuits and Systems*, pp. 593-596, 2004; Vogel et al., "Compensation of timing mismatches in time-interleaved analog-to-digital converters through transfer characteristics tuning," *47th IEEE International Midwest Symposium on Circuits and Systems*, pp. 1341-1344, 2004; Vogel, "A Frequency Domain Method for Blind Identification of Timing Mismatches in Time-Interleaved ADCs," *Proceedings of the IEEE Norchip Conference 2006*, pp. 45-48, Nov. 20-21, 2006; Saleem et al. "LMS-Based Identification and Compensation of Timing Mismatches in a Two-Channel Time-Interleaved Analog-to-Digital Converter," *Proceedings of the IEEE Norchip Conference 2007*, Nov. 19-20, 2007; Vogel et al. "Adaptive Blind Compensation of Gain and Timing Mismatches in M-Channel Time-Interleaved ADCs," *Proceedings of the 14th IEEE International Conference on Electronics, Circuits and Systems*, pp. 49-52, Sep. 1-3, 2008; Vogel et al. "A Flexible and Scalable Structure to Compensate Frequency Response Mismatches in Time-Interleaved ADCs," *IEEE Transactions on Circuits and Systems I: Regular Papers*, accepted for publication; and Elbornsson et al., "Blind Adaptive Equalization of Mismatch Errors in a Time-Interleaved A/D Converter System," *IEEE Transactions on Circuits and Systems I: Regular Papers*, pp. 151-158, Vol. 51, No. 1, January 2004.

SUMMARY

A preferred embodiment of the present invention, accordingly, provides an apparatus. The apparatus comprises a clock generator that generates a plurality of clock signals; a plurality of analog-to-digital converters (ADCs), wherein each ADC is associated with at least one of the clock signals so as to sample an input signal at a plurality of sampling instants, and wherein a correlation function exists between samples from a two or more of the ADCs; a correction circuit that is coupled between the clock generator and at least one of the ADCs; and an estimator that is coupled to the correction circuit and each of the ADCs, wherein the estimator calculates the correlation function and provides an adjustment to the correction circuit to account for sampling mismatch between the plurality of ADCs based at least in part on the correlation function.

In accordance with a preferred embodiment of the present invention, the cost function that is a function of the time differences between associated sampling instants.

In accordance with a preferred embodiment of the present invention, the correction circuit further comprises a plurality of adjustable delay elements, wherein each adjustable delay element is coupled between the clock generator and at least one of the ADCs, and wherein the estimator adjusts at least one of the adjustable delay elements to account for sampling mismatch between the plurality of ADCs based at least in part on the correlation function.

In accordance with a preferred embodiment of the present invention, the clock generator further comprises a divider.

In accordance with a preferred embodiment of the present invention, the estimator iteratively determines adjustments for the delay elements by employing a gradient descent formulation for a predetermined cost function.

In accordance with a preferred embodiment of the present invention, the predetermined cost function (V) is:

$$V = \sum_{i=1}^{M} \left( \frac{R_{i-1,i} - R_{xx}(T_S)}{R'_{xx}(T_S)} \right)^2$$

$$= \sum_{i=1}^{M} \left( \frac{R_{xx}(T_S + \delta_i - \delta_{i-1}) - R_{xx}(T_S)}{R'_{xx}(T_S)} \right)^2,$$

so that $$\Delta_i^{n+1} = \Delta_i^n + \mu(R_{i-1,i} - R_{i,i+1})$$

wherein $R_{lm}$ denotes the correlation function between the $l^{th}$ and $m^{th}$ ADCs, $\Delta_j^k$ denotes a delay for the $k^{th}$ iteration of the $j^{th}$ delay element, $\delta_p$ is a timing error for the $p^{th}$ ADC, and $\mu$ is less than 1 and greater than 0.

In accordance with a preferred embodiment of the present invention, the predetermined cost function (V) is:

$$V = \sum_{i=1}^{M} \left( \frac{R_{i-1,i} - R_{xx}(T_S)}{R'_{xx}(T_S)} \right)^2$$

$$= \sum_{i=1}^{M} \left( \frac{R_{xx}(T_S + \delta_i - \delta_{i-1}) - R_{xx}(T_S)}{R'_{xx}(T_S)} \right)^2,$$

so that $$\Delta_i^{n+1} = \Delta_i^n - \mu \left( \frac{2(R_{i-1,i} - R_{i,i+1})}{R'_{xx}(T_S)} \right),$$

wherein $R_{lm}$ denotes the correlation function between the $l^{th}$ and $m^{th}$ ADCs, $\Delta_j^k$ denotes a delay for the $k^{th}$ iteration of the jth delay element, $\delta_p$ is a delay for the $p^{th}$ ADC, and $\mu$ is less than 1 and greater than 0.

In accordance with a preferred embodiment of the present invention, the apparatus further comprises: a differentiator that receive the input signal; and a coarse ADC that is coupled to the differentiator, the estimator, and the clock generator, wherein at least one of the clock signals is associated with the coarse ADC.

In accordance with a preferred embodiment of the present invention, at least one of the plurality of ADCs is a coarse ADC.

In accordance with a preferred embodiment of the present invention, the cost function is a function of differences between associated sampling instants from the coarse ADC and at least one of the other ADCs.

In accordance with a preferred embodiment of the present invention, an apparatus is provided. The apparatus comprises a clock generator that generates a plurality of clock signals; a plurality of analog-to-digital converters (ADCs), wherein each ADC is associated with at least one of the clock signals so as to sample an input signal at a plurality of sampling instants, and wherein a correlation function exists between samples from a two or more of the ADCs; a correction circuit that is coupled between the clock generator and at least one of the ADCs; and an estimator that is coupled to each of the adjustable delay elements and each of the ADCs, wherein the estimator has a computer program product embodied thereon that includes: computer code for calculating the correlation function; and computer code for providing an adjustment to the correction circuit to account for sampling mismatch between the plurality of ADCs based at least in part on the correlation function.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
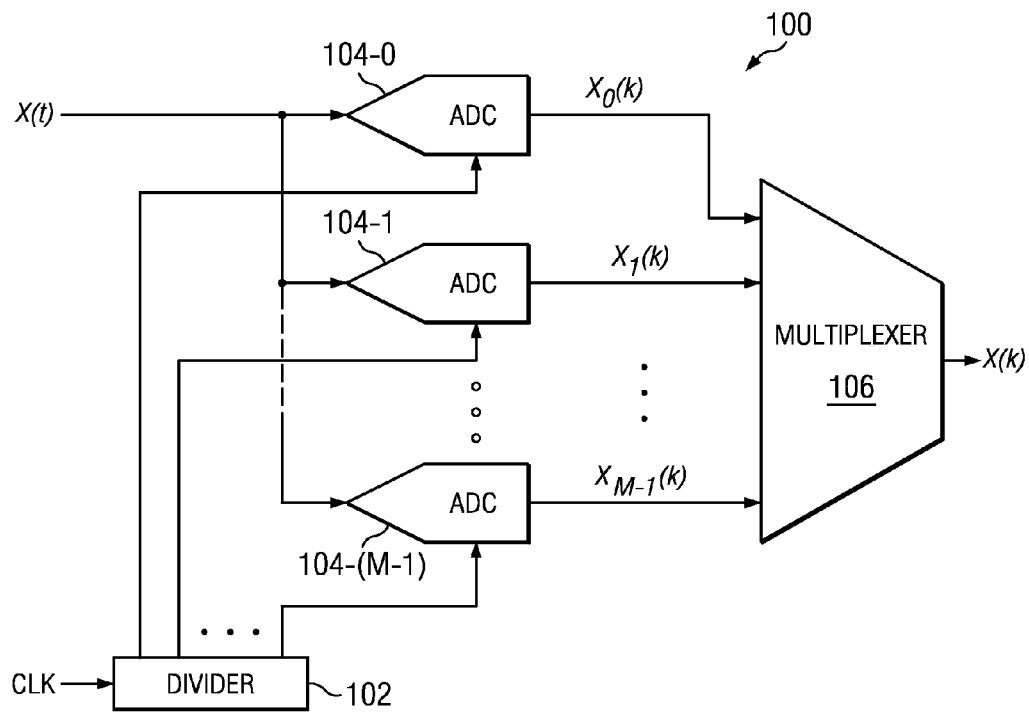
FIG. 1 is a block diagram of an example of a conventional time-interleaved (TI) analog-to-digital converter (ADC)

Refer now to the drawings wherein depicted elements are, for the sake of clarity, not necessarily shown to scale and wherein like or similar elements are designated by the same reference numeral through the several views.

Figure 2A:
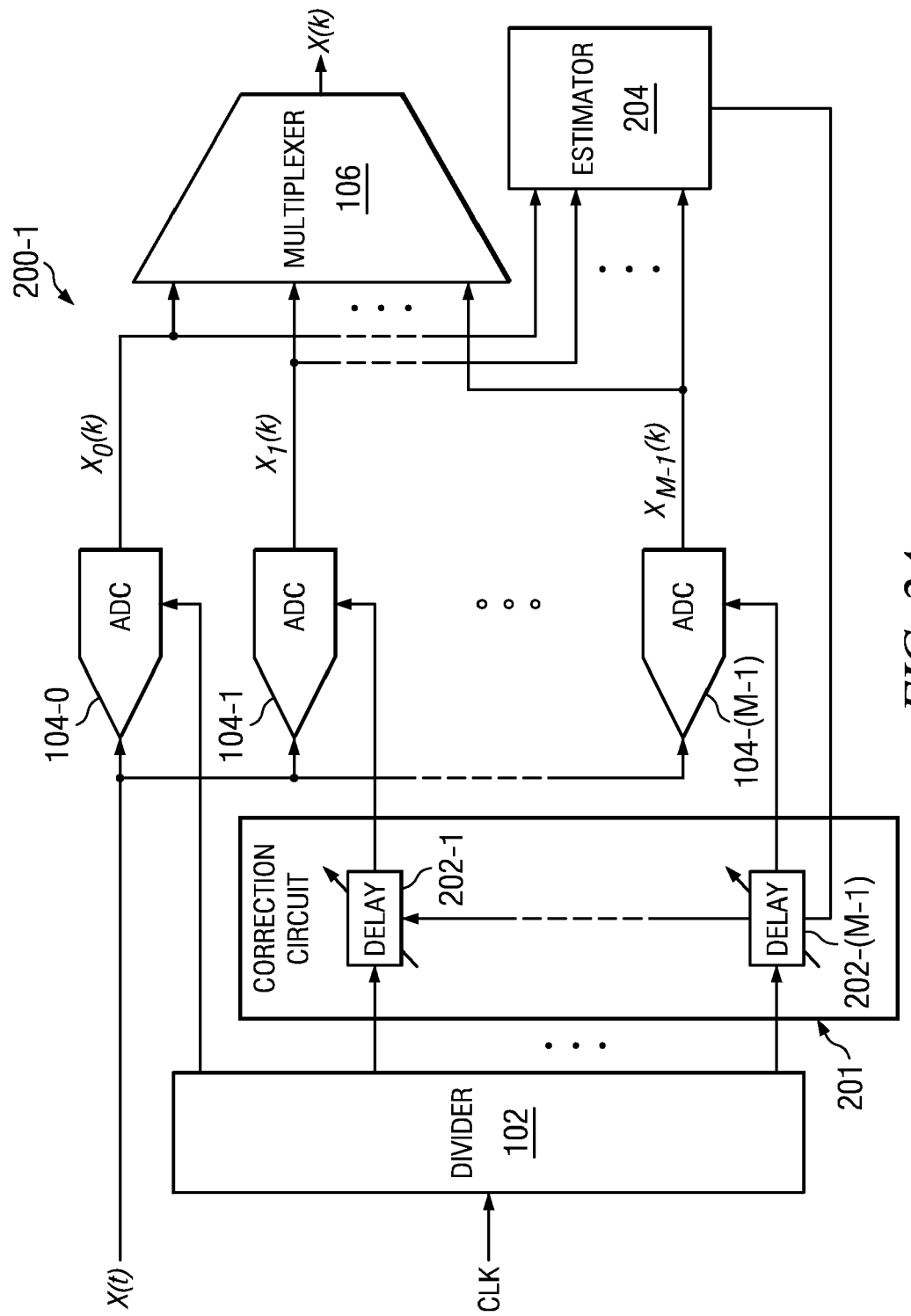
FIGS. 2A through 2D are block diagrams of examples of TI ADCs in accordance with a preferred embodiment of the present invention.

Referring to FIG. 2A of the drawings, the reference numeral 200-1 generally designates a TI ADC in accordance with a preferred embodiment of the present invention. TI ADC 200-1 has a similar construction to TI ADC 100, but TI ADC 200-1 also generally comprises a correction circuit 201 (which is generally comprised of adjustable delay elements 202-1 to 202-(M−1) or other digital schemes) and an estimator 204. Preferably, delays 202-1 to 202-(M−1) are coupled between divider 102 and ADCs 104-1 to 104-(M−1) (respectively) so that each clock signal associated with one of ADCs 104-1 to 104-(M−1) can be delayed. Estimator 204 receives each of the output signals $X_0(k)$ to $X_{M-1}(k)$ so as to calculate the sampling mismatches $\delta_i$ between ADCs 104-1 to 104-(M−1) and account for the mismatches $\delta_i$ by makes adjustments through correction circuit 201 or adjusting the adjustable delay elements 202-1 to 202-(M−1).

In general communications systems, signals are generally wide-sense stationary (WSS) over one block of samples in which estimations can be performed or are "block WSS", which is primarily due to the generally random nature of the transmitted signals. Across multiple blocks of samples, signal statistics can change. Thus, input signal X(t) can generally be thought of as a WSS signal. As a result, a correlation function $R_{i,j}$ exists between samples taken by different ADCs 104-1 to 104-(M−1). This correlation function $R_{i,j}$ is generally a function of the time difference $\tau$ between samples, which can be represented as follows:

$$E[X(t)X(t+\tau)] = R_{xx}(\tau) \qquad (2)$$

Estimator 204, preferably, exploits the correlation structure for these mismatches $\delta_i$. Essentially, the timing error $\delta_0$ for the ADC 104-0 is assumed to be 0, and correlations are calculated between adjacent ADCs 104-1 to 104-(M−1). The correlations $R_{i,j}$ are generally represented as follows:

$$R_{i,i+1} = R_{xx}(T_S + \delta_{i+1} - \delta_i) \forall i \in [0, M-1] \qquad (3)$$

Figure 3:
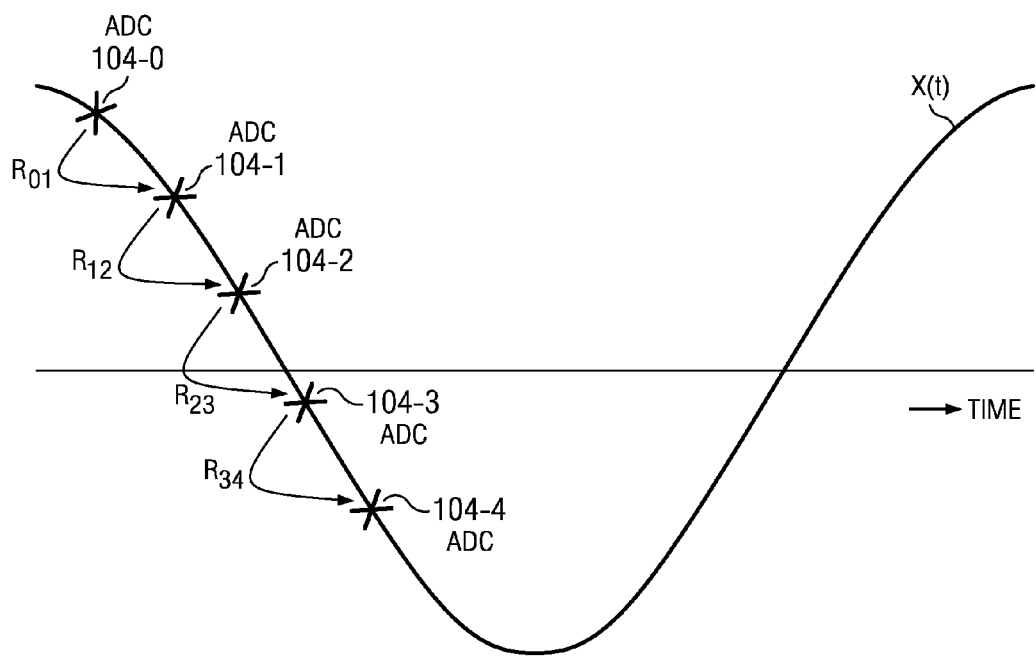
FIG. 3 is a graph depicting sampling instants and an example of correlation function.

Examples of correlations $R_{01}$, $R_{12}$, $R_{23}$, and $R_{34}$ are shown in FIG. 3. Additionally, since the timing error or offsets $\delta_i$ are small ($\ll 1$), a first-order Taylor series approximation can be applied to equation (3) as follows:

$$R_{i,i+1} = R_{xx}(T_S) + (\delta_{i+1} - \delta_i) \left( \frac{dR_{xx}}{dt} \bigg|_{t=T_S} \right), \qquad (4)$$

which can be further represented by the following matrix:

$$\begin{bmatrix} R_{0,1} \\ R_{1,2} \\ \vdots \\ R_{M-2,M-1} \\ R_{M-1,0} \end{bmatrix} = \begin{bmatrix} R'_{xx} & 0 & \cdots & 0 & 1 \\ -R'_{xx} & R'_{xx} & \cdots & 0 & 1 \\ \vdots & \vdots & \ddots & \vdots & \vdots \\ 0 & 0 & \cdots & R'_{xx} & 1 \\ 0 & 0 & \cdots & -R'_{xx} & 1 \end{bmatrix} \begin{bmatrix} \delta_1 \\ \delta_2 \\ \vdots \\ \delta_{M-1} \\ R_{xx}(T_S) \end{bmatrix} \quad (5)$$

Based on the matrix of equation (5), if $R_{xx}'(T_S)$ is known (or some information about it is known), the matrix can be inverted explicitly or iteratively solved.

One correlation scheme is presented below that eliminates $R_{xx}(T_S)$ and which allows for direct computation. Under this scheme, difference $D_i$ is:

$$D_i = R_{i,i+1} - R_{i-1,i} \approx (\delta_{i-1} - 2\delta + \delta_{i+1})\left(\frac{dR_{xx}}{dt}\bigg|_{t=T_S}\right), \quad (6)$$

which can be represented by the following matrix:

$$\begin{bmatrix} D_1 \\ D_2 \\ D_3 \\ \vdots \\ D_{M-2} \\ D_{M-1} \end{bmatrix} = R'_{xx}(T_S) \begin{bmatrix} -2 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 1 & -2 \end{bmatrix} \begin{bmatrix} \delta_1 \\ \delta_2 \\ \delta_3 \\ \vdots \\ \delta_{M-2} \\ \delta_{M-1} \end{bmatrix} \quad (7)$$

Preferably, a low pass filter or an accumulator can operate on the product of adjacent samples to estimate each difference $D_i$. These differences $D_i$, which have been calculated by estimator 204, are used to adjust delay elements 202-1 to 202-(M−1) so that the clock signals from divider or clock generator 102 can be skewed to account for the sample mismatches. This correction method has the overhead of estimating $R_{xx}'(T_S)$ accurately, but if this is ensured, it has very good accuracy and convergence.

Alternatively, an iterative scheme can be employed by estimator 204. Preferably, a method can be applied to a predetermined cost function $V(\delta_1, \ldots, \delta_{M-1})$ to determine the delay $\Delta_i$ for delay element 202-i. Because the delay $\Delta_i$ is essentially 1-dimensional for i, the delay $\Delta_i$ can be expressed as:

$$\Delta_i^{n+1} = \Delta_i^n - \mu \frac{\partial V}{\partial \delta_i} \quad (8)$$

Numerous cost functions $V(\delta_1, \ldots, \delta_{M-1})$ can be employed; however, as an example the following cost function $V(\delta_1, \ldots, \delta_{M-1})$ is used:

$$V = \sum_{i=1}^{M}\left(\frac{R_{i-1,i} - R_{xx}(T_S)}{R'_{xx}(T_S)}\right)^2 \quad (9)$$

$$= \sum_{i=1}^{M}\left(\frac{R_{xx}(T_S + \delta_i - \delta_{i-1}) - R_{xx}(T_S)}{R'_{xx}(T_S)}\right)^2$$

Taking the partial derivative of equation (9) with respect to the timing error $\delta_i$ for ADC 104-i yields:

$$\frac{\partial V}{\partial \delta_i} = 2\left(\frac{R_{xx}(T_S + \delta_i - \delta_{i-1}) - R_{xx}(T_S)}{R'_{xx}(T_S)^2}\right) \quad (10)$$

$$\left(\frac{\partial}{\partial \delta_i}R_{xx}(T_S + \delta_i - \delta_{i-1})\right) +$$

$$2\left(\frac{R_{xx}(T_S + \delta_{i+1} - \delta_i) - R_{xx}(T_S)}{(R'_{xx}(T_S))^2}\right)$$

$$\left(\frac{\partial}{\partial \delta_i}R_{xx}(T_S + \delta_{i+1} - \delta_i)\right)$$

$$\approx \frac{2}{(R'_{xx}(T_S))^2}\binom{(R_{xx}(T_S + \delta_i - \delta_{i-1}) - R_{xx}(T_S)) -}{(R_{xx}(T_S + \delta_{i+1} - \delta_i) - R_{xx}(T_S))}$$

$$= \frac{2}{(R'_{xx}(T_S))^2}\binom{R_{xx}(T_S + \delta_i - \delta_{i-1}) -}{R_{xx}(T_S + \delta_{i+1} - \delta_i)}$$

$$= 2\left(\frac{R_{i-1,i} - R_{i,i+1}}{R'_{xx}(T_S)}\right)$$

From equation (10), the sign of $R_{xx}'(T_S)$ is important, and for most practical cases of interest, $R_{xx}'(T_S)<0$ because:

$$R_{xx}(\tau)=\cos(2\pi f_c \tau) \Rightarrow R_{xx}'(T_S)=-2\pi f_c \sin(2\pi f_c T_S), \quad (11)$$

which indicates that $R_{xx}'(T_S)>0$ for $f_c>1/2T_S=F_S/2$ (greater than the Nyquist frequency). Thus, $R_{xx}'(T_S)$ will almost always be negative, allowing one to express equation (8) as:

$$\Delta_i^{n+1} = \Delta_i^n + \mu(R_{i-1,i} - R_{i,i+1}), \quad (12)$$

which should converge for:

$$0 < \mu < \frac{2}{\max(|R'_{xx}(T_S)|)}. \quad (13)$$

Therefore, this scheme can be implemented in a relatively simple system, but experiences poor convergence, especially when the input signal X(t) is dominated by low frequency components.

As another alternative, a static value can be used for $R_{xx}'(T_S)$ instead of relying on the sign of $R_{xx}'(T_S)$. In this scheme, equation (8) can be expressed (with the use of equation (10)) as:

$$\Delta_i^{n+1} = \Delta_i^n - \mu\left(\frac{2(R_{i-1,i} - R_{i,i+1})}{R'_{xx}(T_S)}\right). \quad (14)$$

In this scheme, $0<\mu\leq 1$ to be stable, and $R_{xx}'(T_S)$ can be estimated using a finite difference by modifying the timing offsets deliberately by a small value. Additionally, $R_{xx}'(T_S)$ can be averaged across different ADCs 104-0 to 104-(M−1) to further improve estimation. By using this scheme, loop convergence is independent of frequency with rapid convergence, but if the statistical properties of the input signal X(t) vary, the TI ADC 200-1 may become unstable if the initial estimate of $R_{xx}'(T_S)$ is used across multiple blocks. For signals whose statistical properties change slowly over time, this operation may be performed periodically to get a good estimate of $R_{xx}'(T_S)$.

Figure 2B:
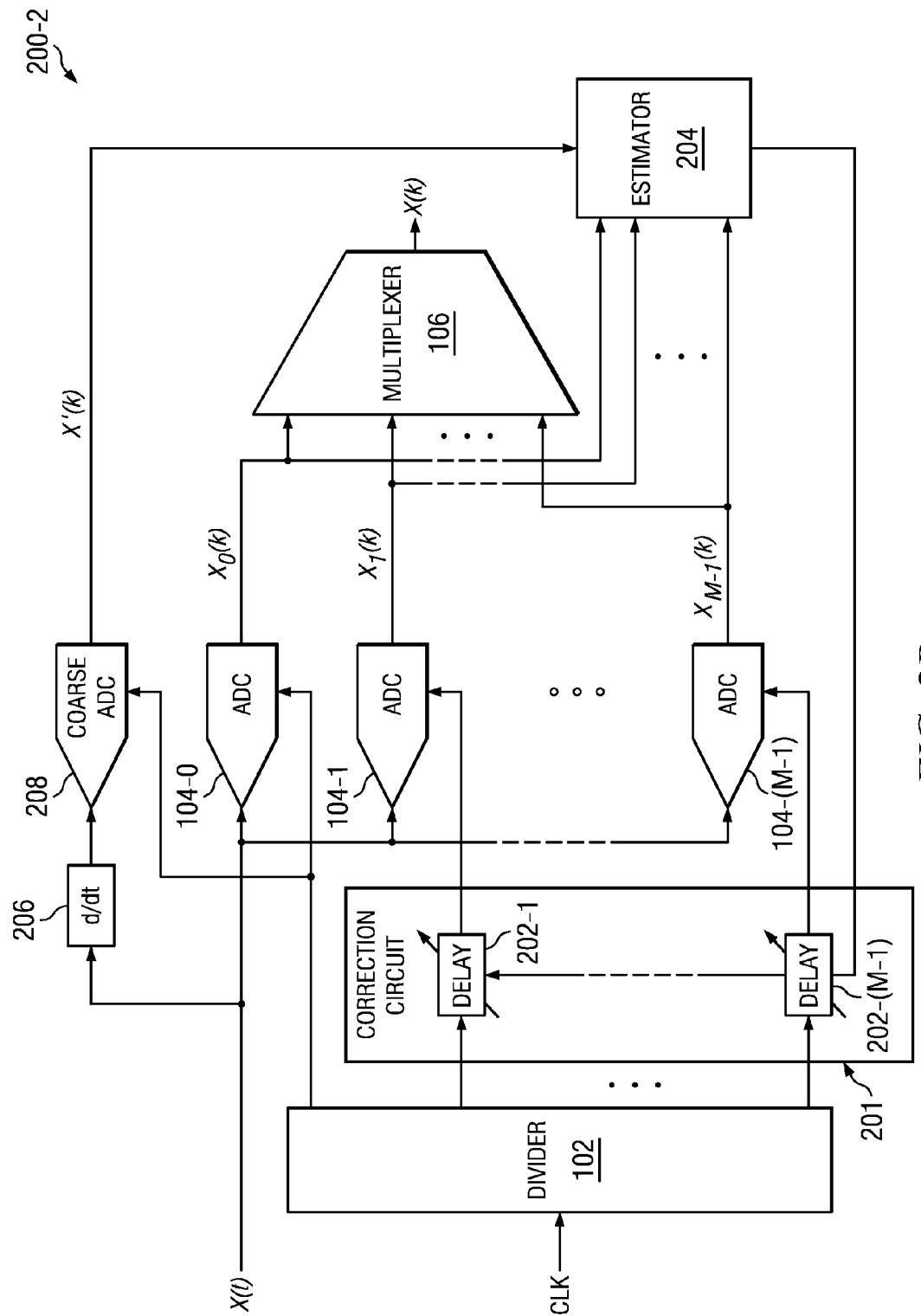

Turning now to FIG. 2B, TI ADC 200-2 can be seen, which dynamically estimates $R_{xx}'(T_S)$. A difference between TI ADCs 200-1 and 200-2 is the use of differentiator 206 and coarse ADC 208 in TI ADC 200-2. A reason to utilize these additional components is to employ a dynamic slope estimation. Preferably, equation (2) can be differentiated and expressed as:

$$E\left[X(t)\frac{dX(t+\tau)}{d\tau}\right] = R'_{xx}(\tau). \quad (15)$$

Thus, for difference for differences γ from period $T_S$, $R_{xx}{}'(T_S+\gamma)$ is:

$$R_{xx}{}'(T_S+\gamma) = R_{xx}{}'(T_S) + \gamma R_{xx}{}''(T_S), \quad (16)$$

which has a general form of:

$$R'_{xx}(T_S) = \frac{1}{M}\sum_{i=0}^{M-1}(-1)^n(R'_{xx}(T_S) + (\delta_{i+1} - \delta_i)R''_{xx}(T_S)) \quad (17)$$

By employing this scheme, convergence occurs even if signal statistics change over time, but this scheme is more complex than the other schemes described above.

Moreover, estimator 204 and/or multiplexer 106 may be replaced by a processor, such as a digital signals processor (DSP), and the computation of the correlation function and adjustments of the delay elements 202-2 to 202-(M−1) may be performed through hardware or software.

Figure 2C:
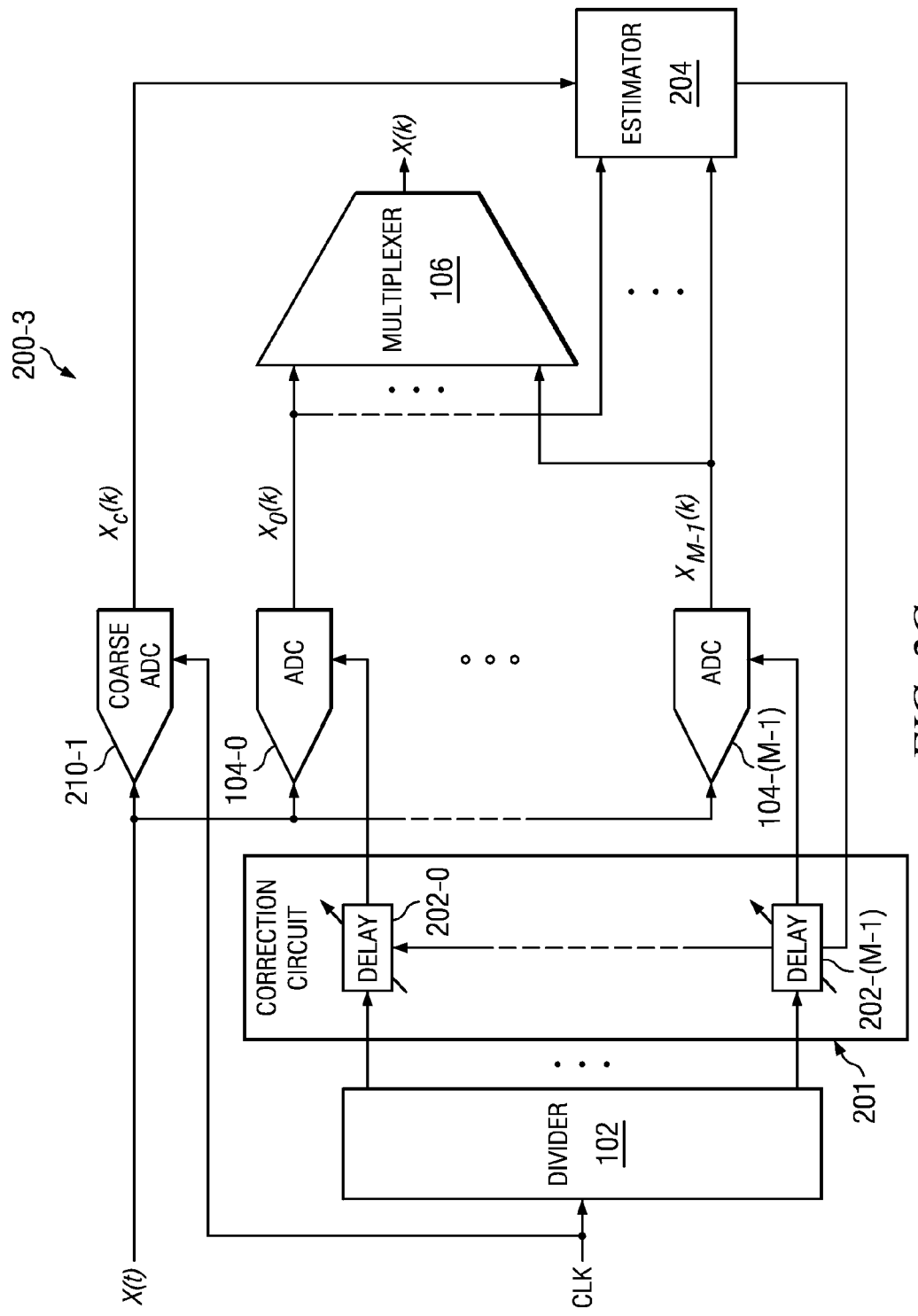

Turning to FIG. 2C, TI ADC 200-3 can be seen, which can be used for non-stationary signals. For stationary signals, correlation function $R_{i,j}$ can be estimated as a time average if ergodicity is assumed to be $$R_{xx}(\tau) \approx \frac{1}{N}\sum_{=0}^{N-1}x(t_k)x(t_k + \tau), \quad (18)$$

which will generally hold true for any set of distinct time samples $\{t_k\}$ and which can be computed using the set of samples corresponding to $\{t_k\}$ and $\{t_k+\tau\}$. In general, such as with cases of deterministic and/or periodic signals, the time averaged autocorrelation will depend on the exact sample times used, and no assumptions about uniformity of correlation across different set of samples can be made such that:

$$R_{xx}(\{t_k\}, \tau) = \frac{1}{N}\sum_{k=0}^{N-1}x(t_k)x(t_k + \tau). \quad (19)$$

In order to handle such a scenario, FIG. 2C, employs the use of coarse ADC 210-1, which receives the input signal X(t), operates at the full frequency of the clock signal CLK, and outputs a coarse (lower accuracy compared to ADCs 104-0 to 104-(M−1)) digital signal $X_C(k)$. Based on this configuration, the outputs for ADC 210-1 and 104-0 to 104-(M−1) can be represented (respectively) as:

$$X_C(k) \approx X(kT_S) \quad (20)$$

$$X_i(k) = X((kM+i)T_S+\delta_i) \forall i \in [0,M-1] \quad (21)$$

The following correlations can then be constructed based on equations (20) and (21):

$$R_{i,C(i+1)} = \frac{1}{N}\sum_{k=0}^{N-1}X((kM+i)T_s + \delta_i)X_c((kM+i+1)T_s) \quad (22)$$

$$R_{C(i),C(i+1)} = \frac{1}{N}\sum_{k=0}^{N-1}X_c((kM+i)T_s)X_c((kM+i+1)T_s) \quad (23)$$

$$R_{C'(i),C(i+1)} = \frac{1}{N}\sum_{k=0}^{N-1}X'_c((kM+i)T_s)X_c((kM+i+1)T_s) \quad (24)$$

Now applying the first-order Taylor series approximation to ADC 200-3, the correlations $R_{i,j}$ can be represented as follows:

$$R_{i,C(i+1)} \approx R_{C(i),C(i+1)} + \delta_i R_{C'(i),C(i+1)} \quad (25)$$

Preferably, a method can now be applied to a predetermined cost function $V(\delta_1, \ldots, \delta_{M-1})$ to determine the delay $\Delta_i$ for delay element 202-i. Because the delay $\Delta_i$ is essentially 1-dimensional for i, the delay $\Delta_i$ can be expressed as equation (8). Numerous cost functions $V(\delta_1, \ldots, \delta_{M-1})$ can be employed; however, as an example the following cost function $V(\delta_1, \ldots, \delta_{M-1})$ is used:

$$V = \sum_{i=1}^{M}\left(\frac{R_{i,C(i+1)} - R_{C(i),C(i+1)}}{R_{C'(i),C(i+1)}}\right)^2 \quad (26)$$

Taking the partial derivative of equation (26) with respect to the timing error $\delta_i$ for ADC 104-i yields:

$$\frac{\partial V}{\partial \delta_i} = 2\left(\frac{R_{i,C(i+1)} - R_{C(i),C(i+1)}}{(R_{C'(i),C(i+1)})^2}\right)\left(\frac{\partial R_{i,C(i+1)}}{\partial \delta_i}\right) \approx 2\left(\frac{R_{i,C(i+1)} - R_{C(i),C(i+1)}}{R_{C'(i),C(i+1)}}\right) \quad (27)$$

Thus, equation (8) can be expressed as:

$$\Delta_i^{n+1} = \Delta_i^n + \mu(R_{i,C(i+1)} - R_{C(i),C(i+1)}) \text{ for } \mu > 0, \quad (28)$$

Equation (28) can also be estimated using a finite difference method yielding:

$$\Delta_i^{n+1} = \Delta_i^n - \mu\frac{2(R_{i,C(i+1)} - R_{C(i),C(i+1)})}{R_{C'(i),C(i+1)}} \text{ for } \mu > 0, \quad (29)$$

which allows the numerator $(R_{i,C(i+1)} - R_{C(i),C(i+1)})$ to be calculated initially because of common terms in the expression while the denominator $2R_{C'(i),C(i+1)}$ is calculated more often to track the time-varying statistics of the input signal X(t).

Figure 2D:
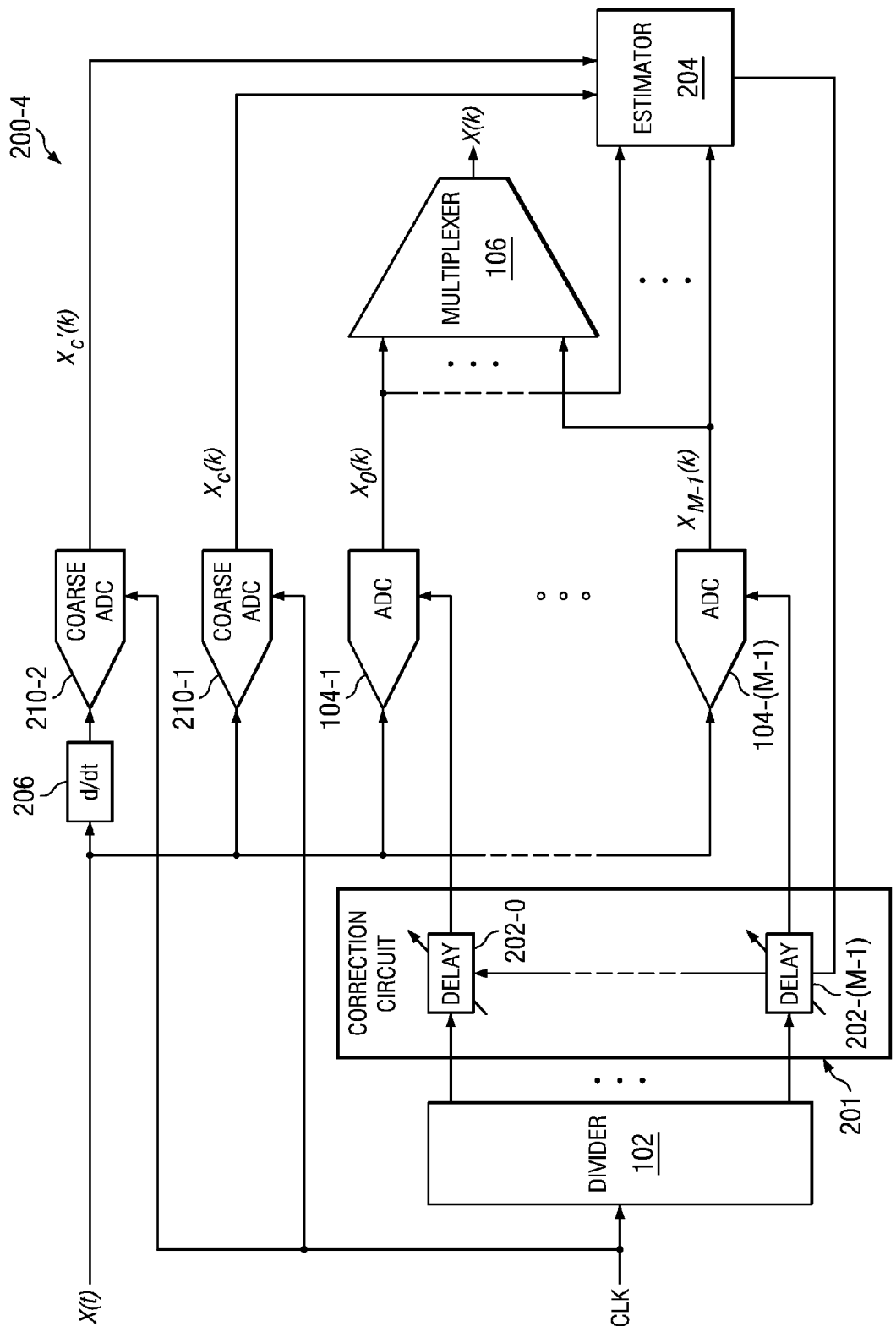

Turning to FIG. 2D, TI ADC 200-4 can be seen, which can be also used for non-stationary signals. A difference between ADC 200-3 and ADC 200-4 is that ADC 200-4 also employs differentiator 206 and coarse ADC 210-2. For this configuration, the outputs for ADC 210-1 and 104-0 to 104-(M−1) can be represented (respectively) as equations (20) and (21) above, while the output of ADC 210-2 is:

$$X'_C(k) \approx \frac{dX(t)}{dt}\bigg|_{t=kT_s} \quad (30)$$

so that equation (15) above applies, and similarly, using the analysis for ADC 200-2 and ADC 200-3, the delays can be calculated. As an example (using TI ADC 200-4), one can consider the non-trivial case of a two tone input signal having the form:

$$x(t) = \cos(\omega_1 t) - \cos(\omega_2 t - \theta), \quad (31)$$

where $$\omega_1 - \omega_2 = \frac{2\pi F_s}{M} \quad (32)$$

and $$\omega_1 \neq \omega_2 \neq 0. \quad (33)$$

The time averaged correlations from equation (22) can be shown to be:

$$R_{i,C(i+1)} \approx R_{C(i),C(i+1)} + \delta_i R_{C(i'),C(i+1)} = \quad (34)$$

$$\left\{ \frac{1}{2} \begin{bmatrix} \cos(\omega_1 T_s) + \\ \cos(\omega_2 T_s) \end{bmatrix} + \frac{1}{2} \begin{bmatrix} \cos\left(\frac{2\pi i}{M} + \omega_2 T_s + \theta\right) + \\ \cos\left(\frac{2\pi i}{M} + \omega_1 T_s + \theta\right) \end{bmatrix} \right\} +$$

$$\delta_i \left\{ \begin{bmatrix} \frac{\omega_1}{2}\sin(\omega_1 T_s) + \frac{\omega_2}{2}\sin(\omega_2 T_s) \end{bmatrix} - \\ \begin{bmatrix} \frac{\omega_1}{2}\cos\left(\frac{2\pi i}{M} + \omega_2 T_s + \theta\right) + \\ \frac{\omega_2}{2}\cos\left(\frac{2\pi i}{M} + \omega_1 T_s + \theta\right) \end{bmatrix} \right\}$$

Therefore, for $M=8$, $F_S=2$, $\omega_1=2\pi F_S/40$, $\omega_2=8\pi F_S/40$, and $\theta=\pi/3$, $R_{C(i'),C(i+1)}$ is (−0.35, −0.28, 0.18, 0.77, 1.14, 1.07, 0.60, 0.02).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a clock generator that generates a plurality of clock signals;
   a plurality of analog-to-digital converters (ADCs), wherein each ADC is associated with at least one of the clock signals so as to sample an input signal at a plurality of sampling instants, and wherein a correlation function exists between samples from a two or more of the ADCs;
   a correction circuit that is coupled between the clock generator and at least one of the ADCs; and
   an estimator that is coupled to the correction circuit and each of the ADCs, wherein the estimator calculates the correlation function and iteratively provides adjustments to the correction circuit to account for sampling mismatch between the plurality of ADCs by employing a gradient descent formulation for a predetermined cost function, wherein the predetermined cost function is a function of the correlation function.

2. The apparatus of claim 1, wherein the correlation function that is a function of the time differences between associated sampling instants.

3. The apparatus of claim 1, wherein the correction circuit further comprises a plurality of adjustable delay elements, wherein each adjustable delay element is coupled between the clock generator and at least one of the ADCs, and wherein the estimator adjusts at least one of the adjustable delay elements to account for sampling mismatch between the plurality of ADCs based at least in part on the correlation function.

4. The apparatus of claim 1, wherein the clock generator further comprises a divider.

5. The apparatus of claim 1, wherein the predetermined cost function (V) is:

$$V = \sum_{i=1}^{M} \left( \frac{R_{i-1,i} - R_{xx}(T_s)}{R'_{xx}(T_s)} \right)^2$$

$$= \sum_{i=1}^{M} \left( \frac{R_{xx}(T_s + \delta_i - \delta_{i-1}) - R_{xx}(T_s)}{R'_{xx}(T_s)} \right)^2,$$

so that $$\Delta_i^{n+1} = \Delta_i^n + \mu(R_{i-1,i} - R_{i,i+1})$$

wherein $R_{lm}$ denotes the correlation function between the $l^{th}$ and $m^{th}$ ADCs, $\Delta_j^k$ denotes a delay for the $k^{th}$ iteration of the $j^{th}$ delay element, $\delta_p$ is a timing error for the $p^{th}$ ADC, and $\mu$ is less than 1 and greater than 0.

6. The apparatus of claim 1, wherein the predetermined cost function (V) is:

$$V = \sum_{i=1}^{M} \left( \frac{R_{i-1,i} - R_{xx}(T_s)}{R'_{xx}(T_s)} \right)^2$$

$$= \sum_{i=1}^{M} \left( \frac{R_{xx}(T_s + \delta_i - \delta_{i-1}) - R_{xx}(T_s)}{R'_{xx}(T_s)} \right)^2,$$

so that $$\Delta_i^{n+1} = \Delta_i^n - \mu\left( \frac{2(R_{i-1,i} - R_{i,i+1})}{R'_{xx}(T_s)} \right),$$

wherein $R_{lm}$ denotes the correlation function between the $l^{th}$ and $m^{th}$ ADCs, $\Delta_j^k$ denotes a delay for the $k^{th}$ iteration of the jth delay element, $\delta_p$ is a delay for the $p^{th}$ ADC, and $\mu$ is less than 1 and greater than 0.

7. An apparatus comprising:
   a clock generator that generates a plurality of clock signals;
   a plurality of analog-to-digital converters (ADCs), wherein each ADC is associated with at least one of the clock signals so as to sample an input signal at a plurality of sampling instants, and wherein a correlation function exists between samples from a two or more of the ADCs;
   a correction circuit that is coupled between the clock generator and at least one of the ADCs;
   an estimator that is coupled to the correction circuit and each of the ADCs, wherein the estimator calculates the correlation function and provides an adjustment to the correction circuit to account for sampling mismatch between the plurality of ADCs based at least in part on the correlation function;
   a differentiator that receives the input signal; and
   a coarse ADC that is coupled to the differentiator, the estimator, and the clock generator, wherein at least one of the clock signals is associated with the coarse ADC.

8. The apparatus of claim 1, wherein at least one of the plurality of ADCs is a coarse ADC.

9. The apparatus of claim 8, wherein the cost function is a function of differences between associated sampling instants from the coarse ADC and at least one of the other ADCs.

10. An apparatus comprising:
a clock generator that generates a plurality of clock signals;
a plurality of analog-to-digital converters (ADCs), wherein each ADC is associated with at least one of the clock signals so as to sample an input signal at a plurality of sampling instants, and wherein a correlation function exists between samples from a two or more of the ADCs;
a correction circuit that is coupled between the clock generator and at least one of the ADCs; and
an estimator that is coupled to the correction circuit and each of the ADCs, wherein the estimator has a computer program product embodied thereon that includes:
computer code for calculating the correlation function; and
computer code for iteratively providing adjustments to the correction circuit to account for sampling mismatch between the plurality of ADCs by employing a gradient descent formulation for a predetermined cost function, wherein the predetermined cost function is a function of the correlation function.

11. The apparatus of claim 10, wherein the correlation function that is a function of the time differences between associated sampling instants.

12. The apparatus of claim 10, wherein the correction circuit further comprises a plurality of adjustable delay elements, wherein each adjustable delay element is coupled between the clock generator and at least one of the ADCs, and wherein the estimator adjusts at least one of the adjustable delay elements to account for sampling mismatch between the plurality of ADCs based at least in part on the correlation function.

13. The apparatus of claim 10, wherein the clock generator further comprises a divider.

14. The apparatus of claim 10, wherein the predetermined cost function (V) is:

$$V = \sum_{i=1}^{M} \left( \frac{R_{i-1,i} - R_{xx}(T_s)}{R'_{xx}(T_s)} \right)^2$$

$$= \sum_{i=1}^{M} \left( \frac{R_{xx}(T_s + \delta_i - \delta_{i-1}) - R_{xx}(T_s)}{R'_{xx}(T_s)} \right)^2,$$

so that $$\Delta_i^{n+1} = \Delta_i^n + \mu(R_{i-1,i} - R_{i,i+1}),$$

wherein $R_{lm}$ denotes the correlation function between the $l^{th}$ and $m^{th}$ ADCs, $\Delta_j^k$ denotes a delay for the $k^{th}$ iteration of the $j^{th}$ delay element, $\delta_p$ is a timing error for the $p^{th}$ ADC, and $\mu$ is less than 1 and greater than 0.

15. The apparatus of claim 10, wherein the predetermined cost function (V) is:

$$V = \sum_{i=1}^{M} \left( \frac{R_{i-1,i} - R_{xx}(T_s)}{R'_{xx}(T_s)} \right)^2$$

$$= \sum_{i=1}^{M} \left( \frac{R_{xx}(T_s + \delta_i - \delta_{i-1}) - R_{xx}(T_s)}{R'_{xx}(T_s)} \right)^2,$$

so that $$\Delta_i^{n+1} = \Delta_i^n - \mu\left( \frac{2(R_{i-1,i} - R_{i,i+1})}{R'_{xx}(T_s)} \right),$$

wherein $R_{lm}$ denotes the correlation function between the $l^{th}$ and $m^{th}$ ADCs, $\Delta_j^k$ denotes a delay for the $k^{th}$ iteration of the jth delay element, $\delta_p$ is a delay for the $p^{th}$ ADC, and $\mu$ is less than 1 and greater than 0.

16. An apparatus comprising:
a clock generator that generates a plurality of clock signals;
a plurality of analog-to-digital converters (ADCs), wherein each ADC is associated with at least one of the clock signals so as to sample an input signal at a plurality of sampling instants, and wherein a correlation function exists between samples from a two or more of the ADCs;
a correction circuit that is coupled between the clock generator and at least one of the ADCs;
an estimator that is coupled to the correction circuit and each of the ADCs, wherein the estimator has a computer program product embodied thereon that includes:
computer code for calculating the correlation function; and
computer code for providing adjustments to the correction circuit to account for sampling mismatch between the plurality of ADCs based at least in part on the correlation function;
a differentiator that receives the input signal; and
a coarse ADC that is coupled to the differentiator, the estimator, and the clock generator, wherein at least one of the clock signals is associated with the coarse ADC.

17. The apparatus of claim 10, wherein the apparatus further comprises at least one of the plurality of ADCs is a coarse ADC.

18. The apparatus of claim 17, wherein the correlation function is a function of differences between associated sampling instants from the coarse ADC and at least one of the other ADCs.

* * * * *

UNITED STATES PATENT AND TRADEMARK OFFICE
CERTIFICATE OF CORRECTION

| | | |
|---|---|---|
| PATENT NO. | : 7,961,123 B2 | Page 1 of 1 |
| APPLICATION NO. | : 12/575337 | |
| DATED | : June 14, 2011 | |
| INVENTOR(S) | : Nagarajan et al. | |

It is certified that error appears in the above-identified patent and that said Letters Patent is hereby corrected as shown below:

On Title page
Under Related Foreign Priority, please add the Indian priority, as indicated in the Filing Receipt mailed by the USPTO.

-- Indian Patent Application No. 1638/CHE/2009, filed on July 9, 2009 --.

Signed and Sealed this
Thirteenth Day of September, 2011

David J. Kappos
*Director of the United States Patent and Trademark Office*